United States Patent [19]

Critelli et al.

[11] Patent Number: 4,959,761
[45] Date of Patent: Sep. 25, 1990

[54] SURFACE MOUNTED LED PACKAGE

[75] Inventors: John Critelli, Point Pleasant; Klaus Oesterheld, Middletown; Carleton DeBaun, Toms River; Bart Dowstra, Barnegat, all of N.J.

[73] Assignee: Dialight Corporation, Manasquan, N.J.

[21] Appl. No.: 454,468

[22] Filed: Dec. 21, 1989

[51] Int. Cl.⁵ .................................... F21V 17/00
[52] U.S. Cl. .............................. 362/226; 362/800
[58] Field of Search ........................ 362/226, 800

[56] References Cited
U.S. PATENT DOCUMENTS 4,555,749 11/1985 Rifkin et al. .................... 362/800 X
4,704,669 11/1987 Brunner.

Primary Examiner—Allen M. Ostrager
Attorney, Agent, or Firm—Oblon, Spivak, McClelland, Maier & Neustadt

[57] ABSTRACT

A surface mounted LED package according to the invention includes a housing having a generally rectangular parallelepipedal shape. A lens is received in a passageway in the housing and has a radiating surface extending beyond the surface of the housing, a rear light collecting surface, and a cavity to receive an LED. An LED is received in the lens cavity. Conductive spring clips engage the housing and make electrical contact with the LED.

10 Claims, 3 Drawing Sheets

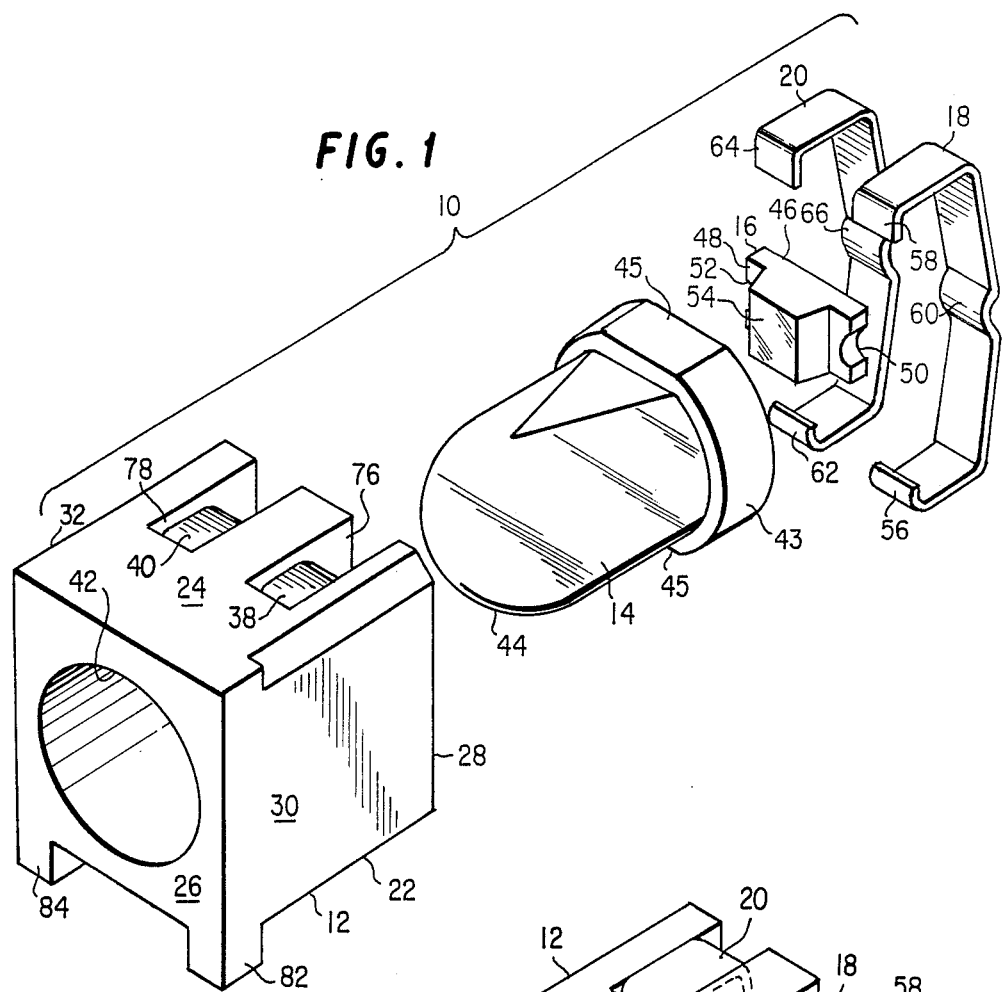
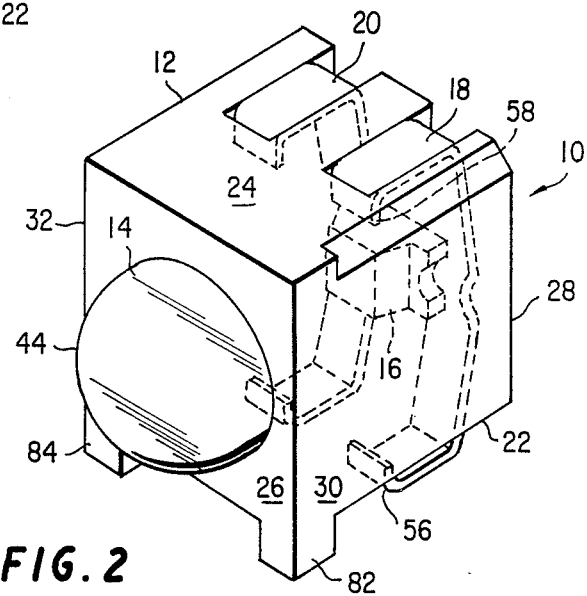

SURFACE MOUNTED LED PACKAGE

FIELD OF THE INVENTION

This invention relates generally to structures for mounting visual indicators on printed circuit boards. It relates particularly to structures for mounting light-emitting diodes ("LEDs") on printed circuit boards using surface mount technology.

CROSS-REFERENCE TO RELATED APPLICATION

This application is related to commonly assigned Application Ser. No. 07/417,469; pending filed Oct. 5, 1989.

BACKGROUND OF THE INVENTION

Printed circuit boards using surface mount technology have several advantages over prior printed circuit boards. In surface mount circuit boards, through holes for mounting devices to the board are completely eliminated. Instead, circuitry is packed close together, and the space usually required for through holes is utilized more efficiently. Accordingly, the boards can be smaller though carrying the same amount of circuitry, or more circuitry can be carried by the same sized board. Furthermore, the components mounted on the circuit boards can be smaller than those used on conventional printed circuit boards.

However, surface mount technology creates certain problems. Since the printed conductors and components must be located closer together than with other printed circuit boards, greater accuracy in the location of components and conductors on the boards is required. Furthermore, since wave soldering usually is not used, radiant heating in an oven or the like usually is used to heat the components and their leads so as to cause the preapplied solder paste to melt and attach the components to the board. The more demanding requirements of surface mount technology place greater demands on the structures and techniques for mounting components, visual indicators, etc. on the circuit boards.

Often it is necessary to mount visual indicators such as LEDs on a printed circuit board with the light elevated above the surface of the board and/or with the LED near to one edge of the board. Each of these requirements creates special problems in the mounting of the LEDs.

The mounting of circuit components on surface mount boards often is accomplished simply by cutting the electrical lead conductors of the devices, bending the conductors to a proper shape, and then soldering them to the pads on to which the devices are to be mounted. This technique also has been used to mount LEDs on surface mount boards. However, the leads usually provided for LEDs tend to be too pliable and narrow to balance the LED on the circuit board until it is soldered. Furthermore, the conical dome shape of LEDs makes them incompatible with surface mount pickand-place mechanisms.

Perhaps the greatest deficiency of the above mounting technique lies in the fact that conventional LEDs are not capable of withstanding the heat associated with solder reflow processes. Through-hole LEDs are constructed by embedding a lead frame in a castable epoxy. Such encapsulants are not structurally sound at solder reflow temperatures. The glass transition temperature for casting epoxies is far lower than the temperature of the soldering furnace. As the epoxy softens, the lead frame is allowed to move, causing the ultimate breakage of the wire bond. Manufacturers that have attempted to use conventional LEDs in surface mount processes have experienced unacceptable failure rates.

Conversely, LEDs designed for surface mounting are well suited for pick-and-place mechanisms, and they can successfully withstand solder temperatures. However, lacking a focusing lens, these miniature devices offer poor optical performance: low light intensity levels, light bleeding when several LEDs are mounted in close proximity, and the unavailability of right-angle viewable devices.

OBJECTS OF THE INVENTION

Accordingly, it is an object of the present invention to provide a structure for mounting visual indicators, particularly LEDs, on printed circuit boards, particularly surface mount boards, with strength, accuracy, and variability in positioning while providing optical enhancements.

It is a further object of the invention to provide optical enhancements that increase light intensity, focus light to reduce light bleeding, and permit rightangle viewing.

It is a still further object of the invention to provide such a structure in which a visual indicator can be mounted a substantial distance above the surface of the board and/or near one edge of the board so that it can be seen more easily and whenever required for any other reason.

It is a further object of the invention to provide such a structure with relatively broad conductive support surfaces for attachment to conductive pads on the boards with a high degree of accuracy and precision and with mechanical strength.

It is a still further object of the invention to provide such a structure which is well adapted for precise positioning on surface mount boards by use of automated positioning equipment.

It is another object of the invention to provide such a structure which is relatively compact and inexpensive to manufacture.

It is a further object of the invention to provide such a structure that lends itself to a wide variety of lens styles (e.g., dome, flat top, square, rectangular, etc.) and radiating surfaces (e.g., flat, fresnel, jewelled, etc.).

It is still a further object of the invention to provide such a structure which overcomes or ameliorates the drawbacks of the prior art discussed above.

SUMMARY OF THE INVENTION

With the foregoing in mind, a surface mounted LED package according to the invention comprises a housing having a generally rectangular parallelepipedal shape, a first surface that, in use, is adjacent a printed circuit board, a second surface opposite the first surface, a third surface joining the first and second surfaces, a fourth surface opposite the third surface, a fifth surface joining the first and second surfaces, a sixth surface opposite the fifth surface, a first shoulder recessed beneath the first surface, a second shoulder recessed beneath the first surface, a third shoulder recessed beneath the second surface, a fourth shoulder recessed beneath the second surface, and a passageway extending from the third surface to the fourth surface; a lens received in the passageway and having a radiating surface extending beyond the third surface of the housing; an LED received in the passageway and having a first surface, a second surface opposite the first surface, a first electrical contact on the first surface, a second electrical contact on the first surface, and a light emitting portion in the second surface facing the lens; a first conductive spring clip having a first finger engaging the first shoulder, a second finger engaging the third shoulder, and a contact portion in electrical contact with the first electrical contact on the first surface of the LED; and a second conductive spring clip having a first finger engaging the second shoulder, a second finger engaging the fourth shoulder, and a contact portion in electrical contact with the second electrical contact on the first surface of the LED.

BRIEF DESCRIPTION OF THE DRAWINGS

FIG. 1 is an exploded perspective view of a surface mounted LED package according to the invention.

FIG. 2 is an assembled perspective view of a surface mounted LED package of the type shown in FIG. 1.

DETAILED DESCRIPTION OF THE PRESENTLY PREFERRED EMBODIMENT

Figure 3:
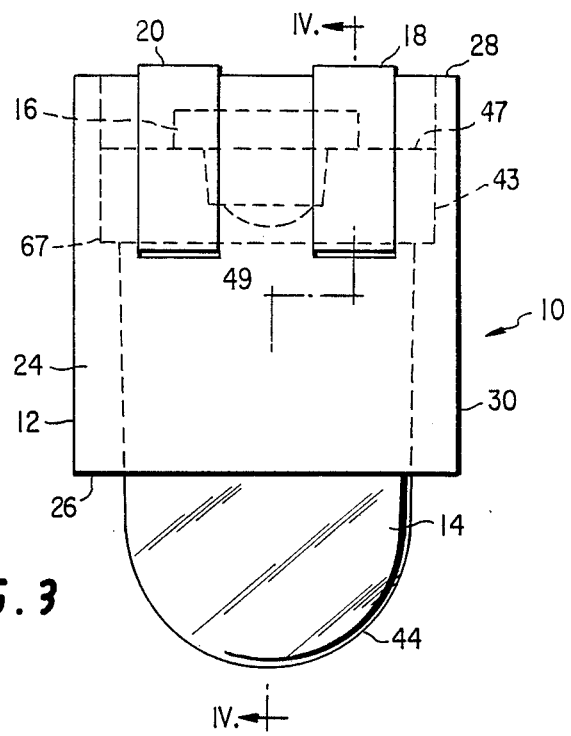
FIG. 3 is a top view of a surface mounted LED package of the type shown in FIG. 1.

A surface mounted LED package 10 according to the invention is illustrated in FIGS. 1–4. It comprises a housing 12, a lens 14, an LED 16, a first conductive spring clip 18, and a second conductive spring clip 20.

As best seen in FIGS. 1 and 2, the housing 12 has a generally rectangular parallelepipedal shape. It has a first surface 22 that, in use, is adjacent a printed circuit board; a second surface 24 opposite the first surface 22; a third surface 26 joining the first surface 22 and the second surface 24; a fourth surface 28 opposite the third surface 26; a fifth surface 30 joining the first surface 22 and the third surface 24; and a sixth surface 32 opposite the fifth surface 30. A first shoulder 34 and a second shoulder 36 are recessed beneath the first surface 22. Similarly, a third shoulder 38 and a fourth shoulder 40 are recessed beneath the second surface 24. A passageway 42 extends from the third surface 26 to the fourth surface 28.

The lens 14 is received in the passageway 42. The lens 14 contains a flange 43 to firmly secure it in place and flat surfaces 45 on both the top and the bottom of the flange 43 to prevent rotation inside the passageway 42.

As best shown in FIG. 3, the lens 14 has a dome-shaped front radiating surface 44 extending beyond the third surface 26 and a rear surface 47 with a cavity to receive the LED 16. Inside the cavity, a light collecting surface 49 is implemented adjacent to a light emitting portion 54 of the LED 16. The light collecting surface 49 can be flat, concave to maximize light entry, or convex to focus light in conjunction with the front radiating surface 44.

Additionally, the lens 14 is not limited to a generally round shape with a dome-shaped front radiating surface 44. Lens barrel shapes following square, rectangular, or other polygonal shapes can be accommodated. Similarly, the front radiating surface 44 can be designed as flat, fresnel, jewelled, or other configurations depending on specific needs.

The LED 16 may be of any conventional kind—for instance, the kind sold under the designation BR 1102W by Stanley. All that is important for present purposes is that it has a first surface 46, a second surface 48 opposite the first surface 46, a first electrical contact 50 on the first surface 46, a second electrical contact 52 on the first surface 46, and the previously mentioned light emitting portion 54 in the second surface 48 facing the lens 14.

The first conductive spring clip 18 has a first finger 56 engaging the first shoulder 34, a second finger 58 engaging the third shoulder 38, and a contact portion 60 in electrical contact with the first electrical contact 50 on the first surface 46 of the LED 16.

The second conductive spring clip 20 has a first finger 62 engaging the second shoulder 36, a second finger 64 engaging the fourth shoulder 40, and a contact portion 66 in electrical contact with the second electrical contact 52 on the first surface 46 of the LED 16.

Figure 4:
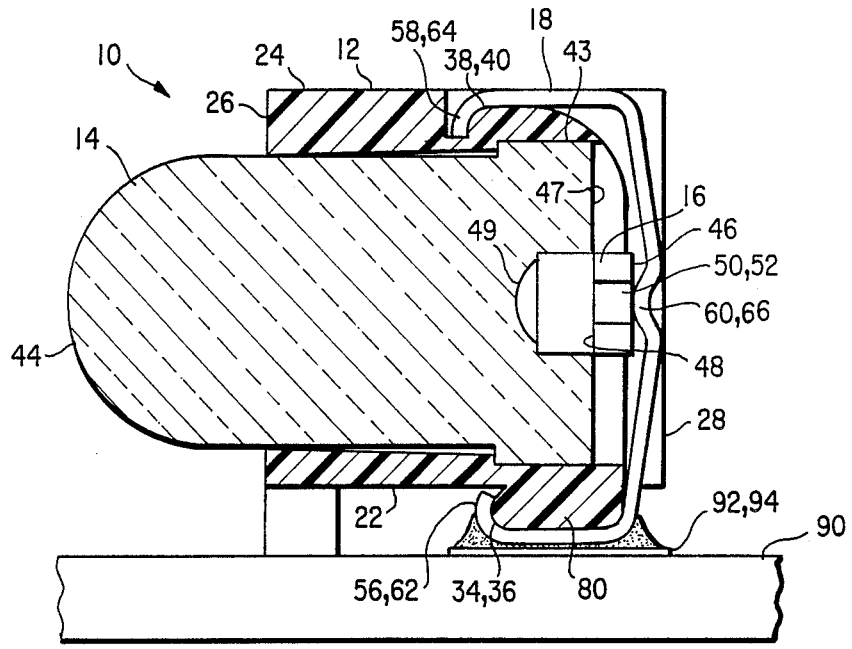
FIG. 4 is a cross sectional view on the broken line IV—IV in FIG. 3.

As best seen in FIGS. 3 and 4, the passageway 42 contains a counterbore 67 to firmly retain the lens 14 against spring tension from the conductive spring clips 18 and 20.

Additionally, the counterbore 67 contains flat portions on its top and on its bottom which, in conjunction with the flat surfaces 45 of the flange 43 of the lens 14, prevents rotation of the lens 14.

As best seen in FIG. 1, a first slot 76 is located in the second surface 24 of the housing 12 extending to the fourth surface 28 of the housing 12, and the third shoulder 38 is located in the first slot 76. Similarly, a second slot 78 is located in the second surface 24 of the housing 12 extending to the fourth surface 28 of the housing 12, and the fourth shoulder 40 is located in the second slot 78.

As best seen in FIG. 4, a ridge 80 is located on the first surface 22 of the housing 12 extending from a point adjacent the fifth surface 30 of the housing 12 to a point adjacent the sixth surface 32 of the housing 12, and the first shoulder 34 and the second shoulder 36 are located on the ridge 80.

A first foot 82 is located on the first surface 22 of the housing 12 adjacent the third surface 26 of the housing 12 and the fifth surface 30 of the housing 12, and a second foot 84 is located on the first surface 22 of the housing 12 adjacent the third surface 26 of the housing 12 and the sixth surface 32 of the housing 12. The first and second feet 82, 84 can rest on a printed circuit board, as shown in FIG. 4, or the first and second feet 82, 84 can be received in through holes in a printed circuit board 90.

As best seen in FIG. 4, in use the first finger 56 of the first conductive spring clip 18 makes electrical contact with a first solder land 92 on the printed circuit board 90, and the first finger 62 of the second conductive spring clip 20 makes electrical contact with a second solder land 94 on the printed circuit board 90.

Figure 5:
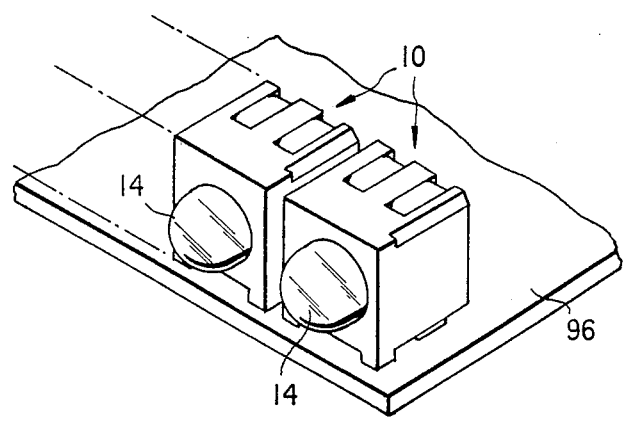
FIG. 5 is a perspective view of an array of two surface mounted LED packages of the type shown in FIG. 1 mounted on the edge of a printed circuit board.

FIG. 5 shows two surface mounted LED packages according to the invention mounted on the edge of a printed circuit board 96.

Figure 6:
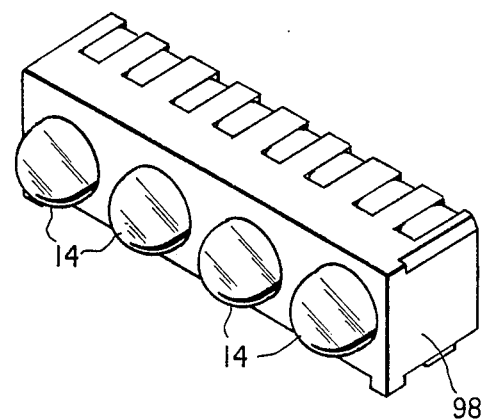
FIG. 6 is a perspective view of a single housing containing a plurality of LEDs.

FIG. 6 illustrates a single housing 98 containing a multiplicity of LEDs and supplemental optics.

Obviously, numerous modifications and variations of the present invention are possible in light of the above teachings. It is therefore to be understood that, within the scope of the appended claims, the invention may be practiced otherwise than as specifically described herein.

What is claimed as new and desired to be secured by Letters Patent of the U.S. is:

1. A surface mounted LED package comprising:
   (a) a housing having:
      (i) a generally rectangular parallelepipedal shape;
      (ii) a first surface that, in use, is adjacent a printed circuit board;
      (iii) a second surface opposite said first surface;
      (iv) a third surface joining said first and second surfaces;
      (v) a fourth surface opposite said third surface;
      (vi) a fifth surface joining said first and second surfaces;
      (vii) a sixth surface opposite said fifth surface;
      (viii) a first shoulder recessed beneath said first surface;
      (ix) a second shoulder recessed beneath said first surface;
      (x) a third shoulder recessed beneath said second surface;
      (xi) a fourth shoulder recessed beneath said second surface; and
      (xii) a passageway extending from said third surface to said fourth surface;
   (b) a lens received in said passageway and having:
      (i) a radiating surface extending beyond said third surface of said housing;
      (ii) a rear surface with a cavity sized and shaped to receive an LED; and
      (iii) a light collecting surface inside above said cavity;
   (c) an LED received in said cavity in said rear surface of said lens, said LED having:
      (i) a first surface;
      (ii) a second surface opposite said first surface;
      (iii) a first electrical contact on said first surface;
      (iv) a second electrical contact on said first surface; and
      (v) a light emitting portion in said second surface facing said lens;
   (d) a first conductive spring clip having:
      (i) a first finger engaging said first shoulder;
      (ii) a second finger engaging said third shoulder; and
      (iii) a contact portion in electrical contact with said first electrical contact on said first surface of said LED; and
   (e) a second conductive spring clip having:
      (i) a first finger engaging said second shoulder;
      (ii) a second finger engaging said fourth shoulder; and
      (iii) a contact portion in electrical contact with said second electrical contact on said first surface of said LED.

2. A surface mounted LED package as recited in claim 1 wherein said light emitting portion of said LED does not touch said lens.

3. A surface mounted LED package as recited in claim 1 wherein said light emitting portion of said LED touches said lens.

4. A surface mounted LED package as recited in claim 1 wherein said passageway comprises:
   (a) a main passageway sized, shaped, and positioned to receive said lens;
   (b) a counterbore sized, shaped, and positioned to secure said lens; and
   (c) a flat portion sized, shaped, and positioned to prevent rotation of said lens.

5. A surface mounted LED packaged as recited in claim 3 wherein said passageway has a cross section sized and shaped to accept said lens.

6. A surface mounted LED package as recited in claim 1 wherein:
   (a) a first slot is located in said second surface of said housing extending to said fourth surface of said housing;
   (b) said third shoulder is located in said first slot;
   (c) a second slot is located in said second surface of said housing extending to said fourth surface of said housing; and
   (d) said fourth shoulder is located in said second slot.

7. A surface mounted LED package as recited in claim 1 wherein:
   (a) a ridge is located on said first surface of said housing extending from a point adjacent said fifth surface of said housing to a point adjacent said sixth surface of said housing and
   (b) said first and second shoulders are located on said ridge.

8. A surface mounted LED package as recited in claim 7 wherein at least one foot is located on said first surface of said housing adjacent said third surface of said housing.

9. A surface mounted LED package as recited in claim 7 wherein:
   (a) a first foot is located on said first surface of said housing adjacent said third and fifth surfaces of said housing and
   (b) a second foot is located on said first surface of said housing adjacent said third and sixth surfaces of said housing.

10. A surface mounted LED package as recited in claim 1 wherein a plurality of lenses and a plurality of LEDs are mounted in a single package.

* * * * *